United States Patent
Tsuji et al.

(10) Patent No.: US 9,473,199 B2
(45) Date of Patent: Oct. 18, 2016

(54) AMPLIFIER CIRCUIT, ANTENNA MODULE, AND RADIO COMMUNICATION DEVICE

(71) Applicants: Masaaki Tsuji, Osaka (JP); Koji Kawahata, Osaka (JP); Nobunari Tsukamoto, Osaka (JP); Takashi Otsuki, Hyogo (JP)

(72) Inventors: Masaaki Tsuji, Osaka (JP); Koji Kawahata, Osaka (JP); Nobunari Tsukamoto, Osaka (JP); Takashi Otsuki, Hyogo (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/762,060

(22) PCT Filed: Feb. 4, 2014

(86) PCT No.: PCT/JP2014/052986
§ 371 (c)(1),
(2) Date: Jul. 20, 2015

(87) PCT Pub. No.: WO2014/126026
PCT Pub. Date: Aug. 21, 2014

(65) Prior Publication Data
US 2015/0358053 A1    Dec. 10, 2015

(30) Foreign Application Priority Data

Feb. 15, 2013  (JP) ................................ 2013-027730
Mar. 13, 2013  (JP) ................................ 2013-050874

(51) Int. Cl.
*H04B 5/02*     (2006.01)
*H04B 1/59*     (2006.01)
(Continued)

(52) U.S. Cl.
CPC  *H04B 1/59* (2013.01); *H03F 1/56* (2013.01); *H03F 3/189* (2013.01); *H04B 1/24* (2013.01);
(Continued)

(58) Field of Classification Search
CPC ........................................................ H04B 5/02
See application file for complete search history.

(56) References Cited

U.S. PATENT DOCUMENTS 6,321,067 B1 * 11/2001 Suga .................... G06K 7/0008
                                                          455/106
6,982,627 B2    1/2006 Oberhuber et al.
(Continued)

FOREIGN PATENT DOCUMENTS

EP      2450835 A2    5/2012
JP      H10-145987    5/1998
(Continued)

OTHER PUBLICATIONS

International Search Report Issued on May 13, 2014 in PCT/JP2014/052986 filed on Feb. 4, 2014.
(Continued)

*Primary Examiner* — Tuan H Nguyen
(74) *Attorney, Agent, or Firm* — Cooper & Dunham LLP

(57) ABSTRACT

An amplifier circuit performs an amplification of a carrier signal received by a transmitting and receiving unit. The amplifier circuit includes an impedance matching circuit that performs matching of an impedance of the amplifier circuit when the transmitting and receiving unit and the amplifier circuit are connected. A superposition wave generating unit generates a superposition wave which is superimposed on the received carrier signal. A driver outputs an amplified carrier signal which is obtained by adding the superposition wave to the received carrier signal. An amplitude detecting unit detects whether the received carrier signal is a predetermined carrier signal superimposed with a predetermined communication signal, based on changes of an amplitude value of the received carrier signal. When the predetermined carrier signal is detected, the amplifier circuit outputs the amplified carrier signal.

17 Claims, 6 Drawing Sheets

(51) Int. Cl.
*H03F 3/189* (2006.01)
*H03F 1/56* (2006.01)
*H04B 1/24* (2006.01)
*H04B 1/04* (2006.01)
*H04B 1/18* (2006.01)

(52) U.S. Cl.
CPC ........... *H04B 5/02* (2013.01); *H03F 2200/255* (2013.01); *H03F 2200/451* (2013.01); *H04B 1/0458* (2013.01); *H04B 1/18* (2013.01)

(56) References Cited

U.S. PATENT DOCUMENTS

| | | | |
|---|---|---|---|
| 7,822,383 | B2 | 10/2010 | Miyagawa et al. |
| 7,973,608 | B2 | 7/2011 | Kato et al. |
| 2008/0030336 | A1 | 2/2008 | Endo et al. |
| 2013/0222058 | A1* | 8/2013 | Maniwa ............ H03G 1/00 330/144 |
| 2014/0300522 | A1 | 10/2014 | Kato et al. |

FOREIGN PATENT DOCUMENTS

| | | |
|---|---|---|
| JP | 2008-061218 | 3/2008 |
| JP | 2009-065426 | 3/2009 |
| JP | 4383785 | 12/2009 |
| JP | 4618672 | 1/2011 |
| JP | 5046877 | 10/2012 |
| JP | 2013-098927 | 5/2013 |

OTHER PUBLICATIONS

Jan. 22, 2016 European Search Report in corresponding European Patent Application No. 14751913.6.

* cited by examiner

AMPLIFIER CIRCUIT, ANTENNA MODULE, AND RADIO COMMUNICATION DEVICE

TECHNICAL FIELD

The present invention relates to an amplifier circuit, an antenna module, and a radio communication device which are adapted to perform an amplification of a carrier signal received by a transmitting and receiving unit.

BACKGROUND ART

Recently, mobile devices that are driven by a secondary battery or the like and perform radio communication at short ranges using RFID (radio frequency identification) are put into widespread use. Regarding the RFID, see Japanese Laid-Open Patent Publication No. 2009-065426. There is a demand for a small-sized, built-in antenna used in the mobile devices. However, the use of a small-sized antenna may reduce communication performance of the mobile devices due to reduction of the gain. Therefore, some mobile devices in recent years are improved to save the arrangement space of an antenna in the device and maintain the communication performance.

Some improvements for such mobile devices are known: one of the improvements is to stick an antenna formed into a thin film to a battery pack including a secondary battery, and another is to arrange a slim piece of an antenna in a lateral or lower corner portion of a housing of the device. However, in the related art, in many cases, a configuration into which an antenna is formed must be decided based on the free space in the mobile device. In many cases, the configuration and the arrangement location of the antenna must be changed to match the size and the configuration of the mobile device. Hence, there has been a need for taking into consideration the configuration and the arrangement location of an antenna for each of individual mobile devices.

If the arrangement location of an antenna in a mobile device is changed, an impedance of the antenna with the latter-stage circuit in the mobile device is also changed. Hence, according to the related art, matching of the impedance of the antenna must have been performed for each of individual mobile devices, and a process of mounting the antenna in the housing has been complicated.

SUMMARY

In one aspect, the present disclosure provides an amplifier circuit which allows for a small-sized antenna, maintains communication performance, and automatically performs impedance matching.

In one embodiment, the present disclosure provides an amplifier circuit that performs an amplification of a carrier signal received by a transmitting and receiving unit, the amplifier circuit including: an impedance matching circuit that performs matching of an impedance of the amplifier circuit when the transmitting and receiving unit and the amplifier circuit are connected; a superposition wave generating unit that generates a superposition wave which is superimposed on the received carrier signal; a driver that outputs an amplified carrier signal which is obtained by adding the superposition wave to the received carrier signal; and an amplitude detecting unit that detects whether the received carrier signal is a predetermined carrier signal superimposed with a predetermined communication signal, based on changes of an amplitude value of the received carrier signal, wherein, when the predetermined carrier signal is detected, the amplifier circuit outputs the amplified carrier signal.

In one embodiment, the present disclosure provides an amplifier circuit including: a carrier detecting unit that detects a carrier signal from an input signal; an amplitude detecting unit that detects whether the detected carrier signal is a predetermined carrier signal on which a predetermined communication signal is carried based on changes of an amplitude value of the detected carrier signal; a superposition wave generating unit that generates a superposition wave which is superimposed on and synchronized in phase with the detected carrier signal; and a driver that outputs an amplified carrier signal which is obtained by adding the superposition wave to the detected carrier signal and amplifying the detected carrier signal, wherein, when the predetermined carrier signal is detected, the amplifier circuit outputs the amplified carrier signal.

DESCRIPTION OF EMBODIMENTS

A description will be given of embodiments with reference to the accompanying drawings.

Figure 1:
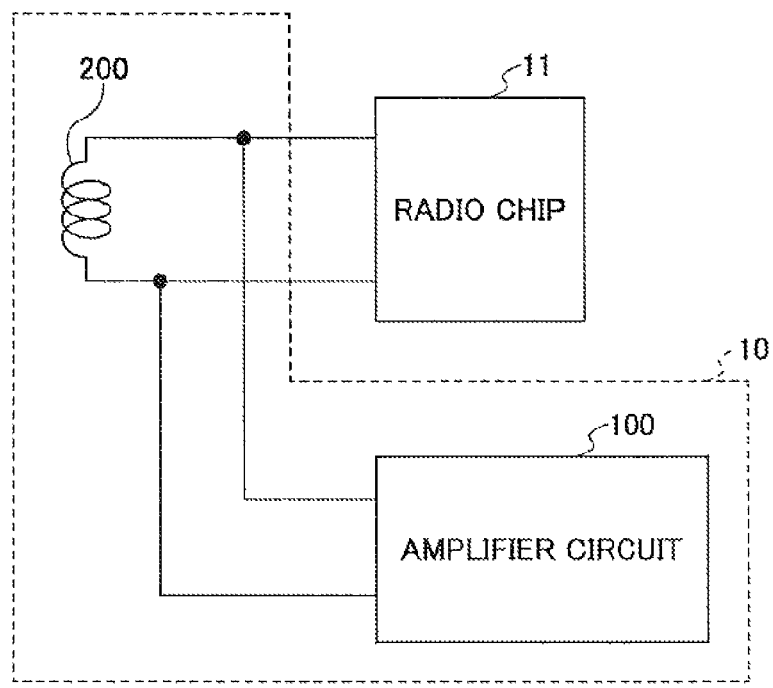
FIG. 1 is a diagram showing an antenna module according to an embodiment.

FIG. 1 is a diagram showing an antenna module 10 according to an embodiment. The antenna module 10 according to the embodiment includes an amplifier circuit 100 and an antenna 200, and this antenna module 10 is connected to a radio chip 11. The amplifier circuit 100 may be an analog circuit called an analog front end (AFE).

In this embodiment, a superposition signal of a predetermined frequency is superimposed on a carrier signal received by an antenna, and the carrier signal superimposed with the superposition signal is output to a radio communication device. Hence, a small-sized antenna may be provided and the communication performance may be maintained. Further, in this embodiment, matching of an impedance of the antenna with a latter-stage circuit (not shown) is automatically performed.

As shown in FIG. 1, the antenna module 10 according to the embodiment is connected to the radio chip 11. When a communication signal (modulation signal) to convey information represented by changes of the amplitude of the communication signal is carried on a carrier signal received from the antenna 200, the antenna module 10 amplifies the received carrier signal and transmits the amplified carrier signal, in which the signal amplitude changes are increased, to the radio chip 11. Hence, the antenna module 10 according to the embodiment may allow for a small-sized antenna and maintain the communication performance.

Figure 2:
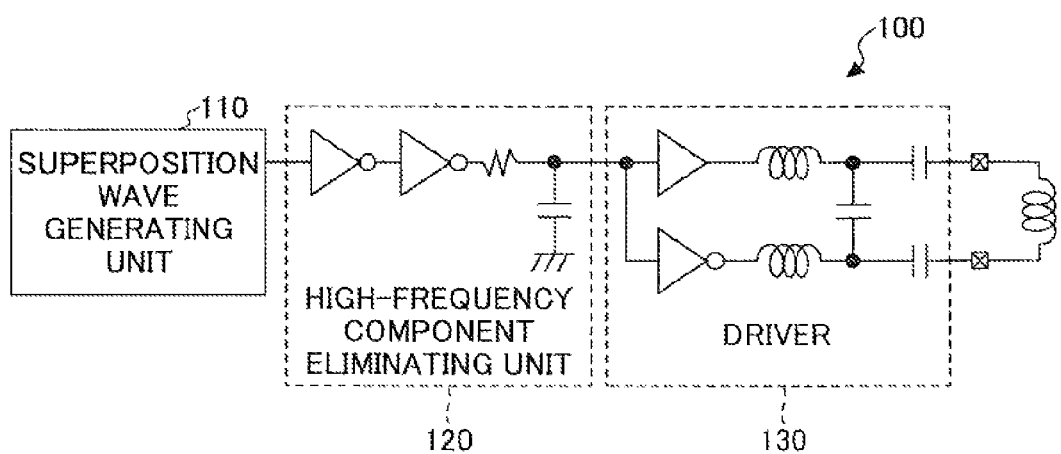
FIG. 2 is a diagram for explaining an amplification of a carrier signal.

An amplification of a carrier signal performed by the amplifier circuit 100 according to the embodiment will be described with reference to FIG. 2. FIG. 2 is a diagram for explaining the amplification of a carrier signal.

As shown in FIG. 2, the amplifier circuit 100 generally includes a superposition wave generating unit 110, a high-frequency component eliminating unit 120, and a driver 130. In the amplifier circuit 100, the superposition wave generating unit 110 generates a superposition signal (superposition wave) of a predetermined frequency, and the high-frequency component eliminating unit 120 eliminates a high-frequency component from the generated superposition signal from the superposition wave generating unit 110. The generated superposition signal from which the high-frequency component is eliminated is added to the carrier received by the antenna 200 through the driver 130. Hence, in the amplifier circuit according to the embodiment, the increased amplitude of the carrier may be provided, and even when the gain falls due to the use of a small-sized antenna, the communication performance may be maintained.

Figure 3:
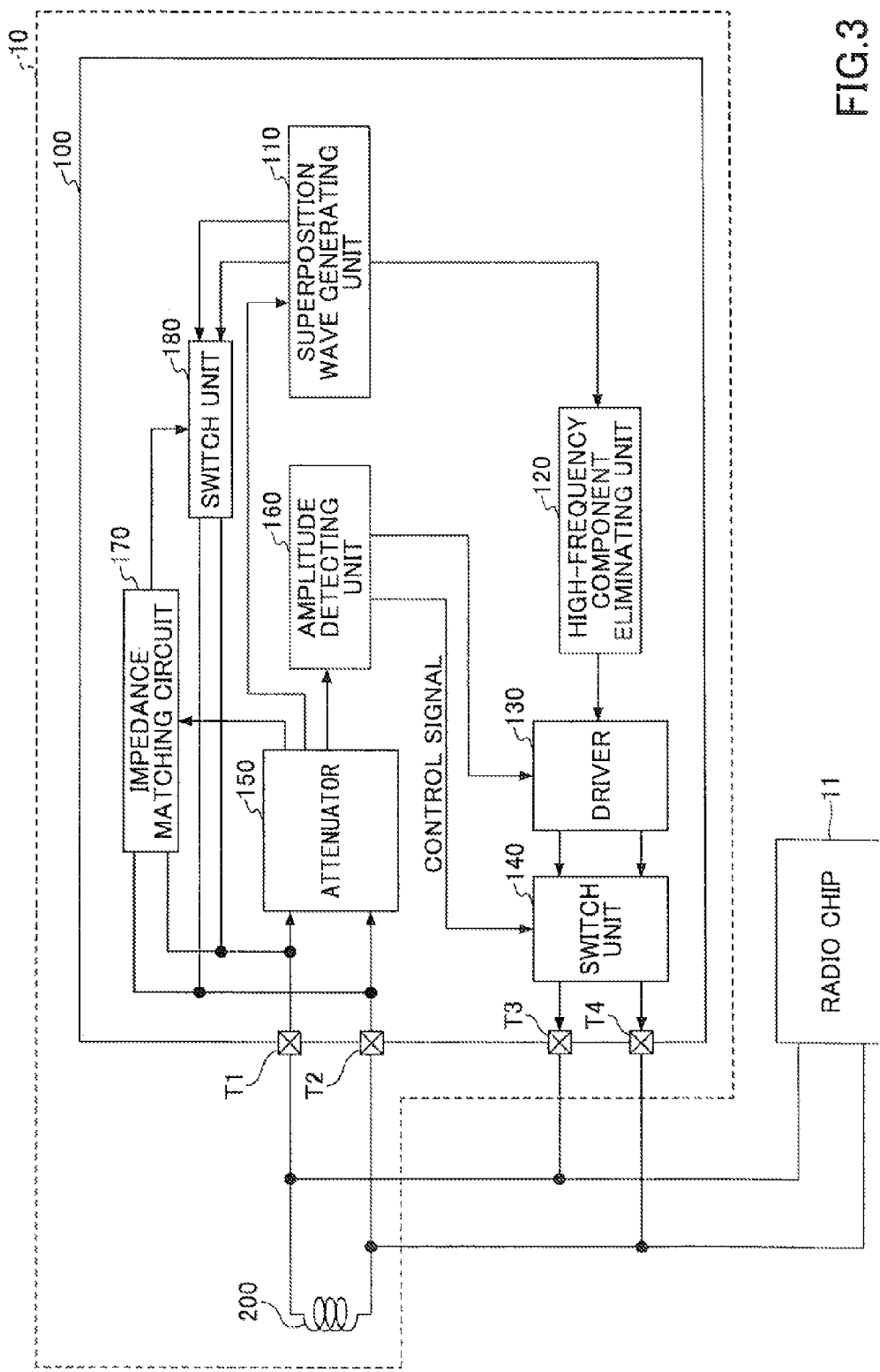
FIG. 3 is a diagram showing an amplifier circuit according to an embodiment.

FIG. 3 is a diagram showing the amplifier circuit 100 according to the embodiment.

As shown in FIG. 3, the amplifier circuit 100 includes the superposition wave generating unit 110, the high-frequency component eliminating unit 120, the driver 130, switch units 140 and 180, an attenuator 150, an amplitude detecting unit 160, and an impedance matching circuit 170. The amplifier circuit 100 further includes a plurality of terminals T1-T4. In the amplifier circuit 100, the terminals T1 and T2 serve as input terminals, and the terminals T3 and T4 serve as output terminals.

In the amplifier circuit 100, the input terminals T1 and T2 are connected to the antenna 200, and the output terminals T3 and T4 are connected to the radio chip 11. The antenna 200 is connected to the radio chip 11.

The amplifier circuit 100 detects whether a carrier signal received from the terminals T1 and T2 is a predetermined carrier signal on which a predetermined communication signal is carried, based on changes of the amplitude value of the received carrier signal. When the predetermined carrier signal is detected, the amplifier circuit 100 superimposes the received carrier signal with the superposition signal (superposition wave) of the predetermined frequency, amplifies such carrier signal, and outputs the amplified carrier signal to the radio chip 11.

Next, the radio chip 11 used for the amplifier circuit according to the embodiment will be described. The radio chip 11 is a radio communication unit which performs radio communication using the amplified carrier signal from the amplifier circuit 100. For example, the radio chip 11 may be an RFID chip, and the RFID chip 11 may include a memory which stores identification information to identify a mobile device on which the radio chip 11 is mounted. Alternatively, the radio chip 11 may be an RFID controller which functions as an RFID reader/writer.

For example, when the radio chip 11 as an RFID chip approaches an RFID reader, the antenna module 10 connected to the radio chip 11 receives a carrier signal of a predetermined frequency (e.g., 13.56 MHz) sent by the RFID reader via the antenna 200.

In the antenna module 10 according to the embodiment, when the carrier signal received by the antenna 200 carries a communication signal representing information by changes of the signal amplitude, the amplifier circuit 100 amplifies the received carrier signal and outputs the amplified carrier signal to the radio chip 11. In the following, the carrier signal carrying the communication signal will be called a modulation carrier signal.

When a modulation carrier signal is received from the amplifier circuit 100, the radio chip 11 returns a response signal via the antenna module 10 by a load modulation which changes a load (not shown) in the radio chip 11. A period for which the radio chip 11 returns the response signal is a period for which the antenna 200 receives a carrier signal whose amplitude value does not change.

Figure 4:
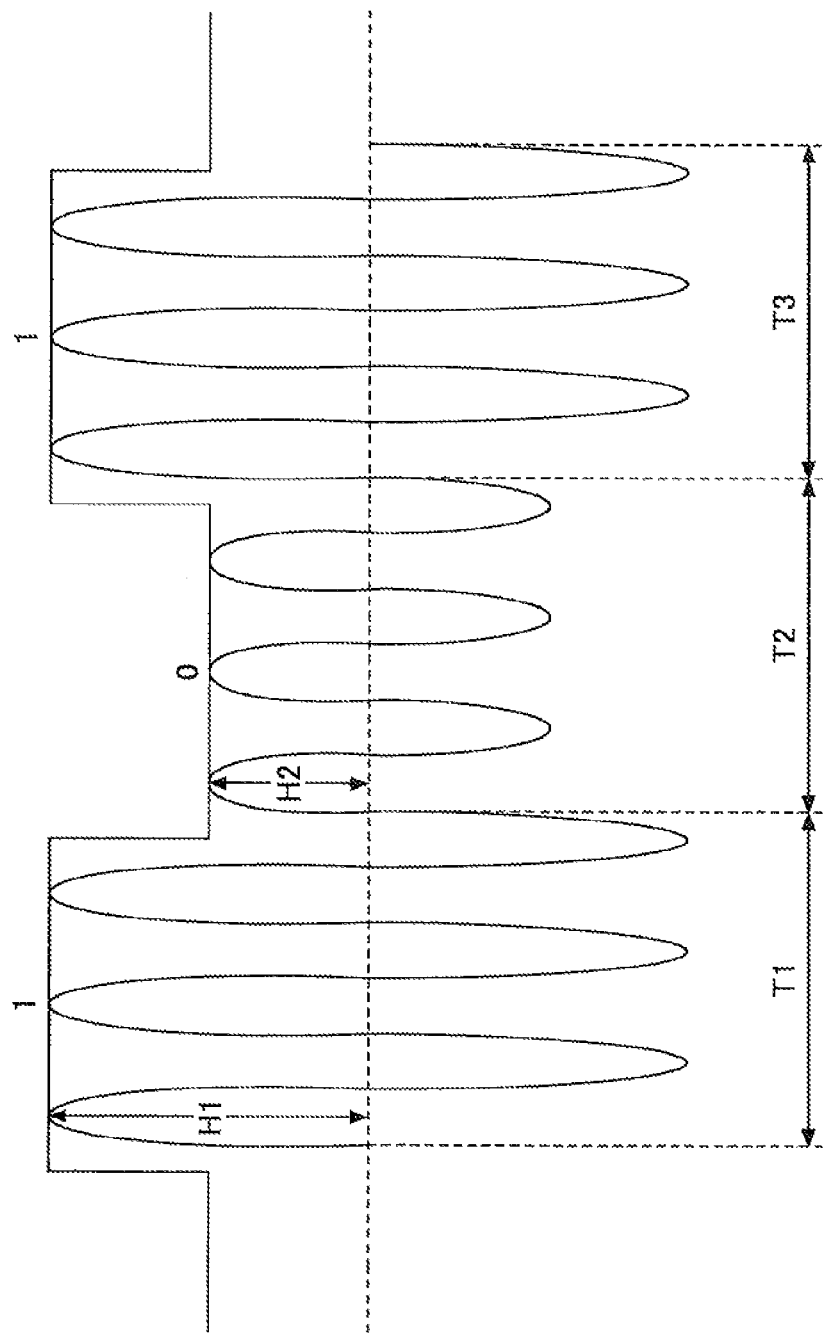
FIG. 4 is a diagram for explaining a modulation carrier signal input to the amplifier circuit.

FIG. 4 is a diagram showing a modulation carrier signal input to the amplifier circuit. In FIG. 4, an example of the modulation carrier signal sent by the RFID reader is illustrated. As shown in FIG. 4, it is assumed that the modulation carrier signal sent by the RFID reader in this example is represented by a carrier signal in which signal waves of amplitude H1 and signal waves of amplitude H2 are alternately present at a predetermined frequency.

In the amplifier circuit 100 according to the embodiment, reception of a modulation carrier signal is detected, the superposition wave is superimposed on the modulation carrier signal, and the resulting modulation carrier signal is amplified and output to the radio chip 11. The radio chip 11 operates in response to the amplified modulation carrier signal received from the amplifier circuit 100 as an energy source, converts the identification information stored in the memory into the amplitude of the non-modulation range of the amplified modulation carrier signal, and returns the resulting signal to an RFID reader.

The details of the amplifier circuit 100 according to the embodiment will be described. As described above, the amplifier circuit 100 includes the superposition wave generating unit 110, the high-frequency component eliminating unit 120, the driver 130, the switch units 140 and 180, the attenuator 150, the amplitude detecting unit 160, and the impedance matching circuit 170.

The superposition wave generating unit 110 generates a superposition wave of a predetermined frequency so that the superposition wave is superimposed on the modulation carrier signal received from the antenna 200. In this embodiment, the generated superposition wave is synchronized in phase with the modulation carrier signal which is received from, for example, an RFID reader, and the frequency of the superposition wave is equal to the frequency of the modulation carrier signal. Alternatively, the phase of the superposition wave may not be the same as the phase of the modulation frequency. Note that the superposition wave generating unit 110 in this embodiment supplies a superposition signal of a frequency equal to the frequency of the received carrier signal to the attenuator 150 via the switch unit 180 at the time of the impedance matching which will be described later.

The high-frequency component eliminating unit 120 eliminates a high-frequency component from the superposition wave generated by the superposition wave generating unit 110. The driver 130 outputs an amplified carrier signal that is obtained by adding the superposition wave to the modulation carrier signal and amplifying the modulation carrier signal. In the following, the carrier signal obtained by adding the superposition wave to the modulation carrier signal and amplifying the modulation carrier signal will be called an amplified modulation carrier signal.

The switch unit 140 is provided to control connection between the output of the driver 130 and the output terminals T3 and T4. Turning ON and OFF of the switch unit 140 is controlled in response to a control signal output from the amplitude detecting unit 160.

The attenuator 150 attenuates the carrier signal received from the terminals T1 and T2. The resulting carrier signal at the output of the attenuator 150 is supplied to the impedance matching circuit 170.

The amplitude detecting unit 160 detects a modulation carrier signal from the carrier signal received from the terminals T1 and T2 via the attenuator 150, and supplies the detected modulation carrier signal to the driver 130. When the modulation carrier signal is detected, the amplitude detecting unit 160 outputs a control signal to the switch unit 140 so that the switch unit 140 is turned ON by the control signal. The details of the amplitude detecting unit 160 will be described later.

The impedance matching circuit 170 is connected between the terminals T1, T2 and the attenuator 150 and performs matching of the impedance of the antenna module 10 as a whole. The impedance matching circuit 170 controls turning ON and OFF of the switch unit 180. The details of the impedance matching circuit 170 will be described later.

Next, operation of the amplifier circuit 100 according to the embodiment relating to the amplification of a carrier signal will be described.

First, operation of the antenna module 10 to receive a modulation carrier signal will be described. In the antenna module 10, when a carrier signal is received from the antenna 200, the input carrier signal is supplied to the amplitude detecting unit 160 via the attenuator 150.

The amplitude detecting unit 160 detects whether the received signal is a modulation carrier signal based on the amplitude of the carrier signal received via the attenuator 150. For example, the amplitude detecting unit 160 may be implemented by a binarizing circuit, such as a comparator including a carrier eliminating filter. When the amplitude value of the carrier signal received from the attenuator 150 indicates the amplitude H1 (FIG. 4), the amplitude detecting unit 160 may output a high-level (H level) binary signal. When the amplitude value of the carrier signal indicates the amplitude H2 (FIG. 4), the amplitude detecting unit 160 may output a low-level (L level) binary signal. In the following, the binary signal output by the amplitude detecting unit 160 based on the amplitude detected by the amplitude detecting unit 160 will be called a modulation binary signal.

For example, when the binary value of the modulation binary signal output by the amplitude detecting unit 160 changes in a sequential pattern of 1 (the H level at a first period T1), 0 (the L level at a second period T2), 1 (the H level at a third period T3), . . . as shown in FIG. 4, the amplitude detecting unit 160 detects the carrier signal input to the terminals T1 and T2 as being the modulation carrier signal. However, the method of detecting the modulation carrier signal by the amplitude detecting unit 160 is not limited to the above-described pattern method. For example, the amplitude detecting unit 160 may be configured to detect the input carrier signal as being the modulation carrier signal when the binary value of the modulation binary signal changes in another predetermined sequential pattern.

When the modulation carrier signal is detected, the amplitude detecting unit 160 outputs a control signal to the switch unit 140 so that the switch unit 140 is turned ON or OFF. Specifically, the amplitude detecting unit 160 outputs the control signal causing the switch unit 140 to be turned ON, when the modulation carrier signal is detected. Further, the amplitude detecting unit 160 outputs the detected modulation carrier signal to the driver 130 at the same time.

In this embodiment, the input carrier signal is supplied to the superposition wave generating unit 110 via the attenuator 150 and the driver 130. It is preferred that the superposition wave generating unit 110 is able to perform phase correction to match the phase of the carrier signal and the phase of the superposition wave. For example, the superposition wave generating unit 110 may be implemented by a PLL (phase locked loop) circuit.

When the switch unit 140 is turned ON by the control signal, the driver 130 is connected to the terminals T3 and T4 by the ON-state switch unit 140.

In this embodiment, the superposition wave generated by the superposition wave generating unit 110 and the modulation binary signal supplied through the amplitude detecting unit 160 are input to the driver 130. In the driver 130, the modulation carrier signal is converted into an amplified modulation carrier signal which is obtained by adding the superposition wave to the modulation carrier signal and amplifying the modulation carrier signal. This amplified modulation carrier signal is supplied to the radio chip 11 via the terminals T3 and T4.

Next, operation of the antenna module 10 to transmit a response signal output from the radio chip 11 will be described.

When a response signal output from the radio chip 11 is transmitted to an RFID reader, the antenna module 10 according to the embodiment does not performs the amplification of the response signal. The signal output from the radio chip 11 is a signal in which the amplitude value of the amplified modulation carrier signal is changed by the load modulation. In this case, the amplitude detecting unit 160 detects that the received signal is not the predetermined carrier signal.

In the antenna module 10, the terminals T1 and T2 are connected also to the radio chip 11. Hence, there is a case in which the response signal output from the radio chip 11 may be input to the antenna module 10. In this case, the amplitude value of the carrier signal input to the terminals T1 and T2 does not match the predetermined pattern. Hence, the switch unit 140 is in an OFF state, the driver 130 is not connected to the terminals T3 and T4, and the antenna module 10 does not output any signal. Therefore, in this case, the signal output from the radio chip 11 is simply supplied to the antenna 200.

Accordingly, in this embodiment, only when the carrier signal received from the antenna 200 is the modulation carrier signal carrying the communication signal, the amplified modulation carrier signal obtained by adding the superposition wave to the modulation carrier signal is supplied to the radio chip 11. Therefore, in the amplifier circuit according to the embodiment, a small-sized antenna may be provided and the communication performance may be maintained.

In the above embodiment, when the modulation carrier signal is detected, the amplitude detecting unit 160 outputs the control signal to the switch unit 140 so that the switch unit 140 is turned ON, and the driver 130 is connected to the terminals T3 and T4. However, the present disclosure is not limited to this embodiment.

For example, the above embodiment may be modified so that only when the amplitude value of the carrier signal indicates the amplitude H1, the amplitude detecting unit 160 outputs the control signal to the switch unit 140 so that the switch unit 140 is turned ON to connect the driver 130 to the terminals T3 and T4. In this case, the switch unit 140 is turned ON at the first period T1 and at the third period T3 respectively as shown in FIG. 4 and the superposition wave is added to the carrier signal. Hence, the amplitude value of the amplified modulation carrier signal output from the driver 130 is increased only at the periods T1 and T3 respectively, and the amount of the amplitude change may be increased.

In the above embodiment, the antenna module 10 has the composition including the amplifier circuit 100 and the antenna 200. Alternatively, the antenna module 10 may further include the radio chip 11 in addition to the amplifier circuit 100 and the antenna 200. Further, in the above embodiment, the radio chip 11 and the amplifier circuit 100 are connected in parallel with the antenna 200. The present disclosure is not limited to this embodiment. For example, the radio chip 11 may be connected to the latter-stage part of the amplifier circuit 100.

Next, the impedance matching performed in the amplifier circuit 100 according to the embodiment will be described. In the amplifier circuit 100 according to the embodiment, matching of the impedance of the antenna module 10 is performed. More specifically, the amplifier circuit 100 performs matching of the impedance of the antenna module 10 by using the impedance matching circuit 170 so that the frequency of the carrier signal is changed to a resonant frequency.

Figure 5:
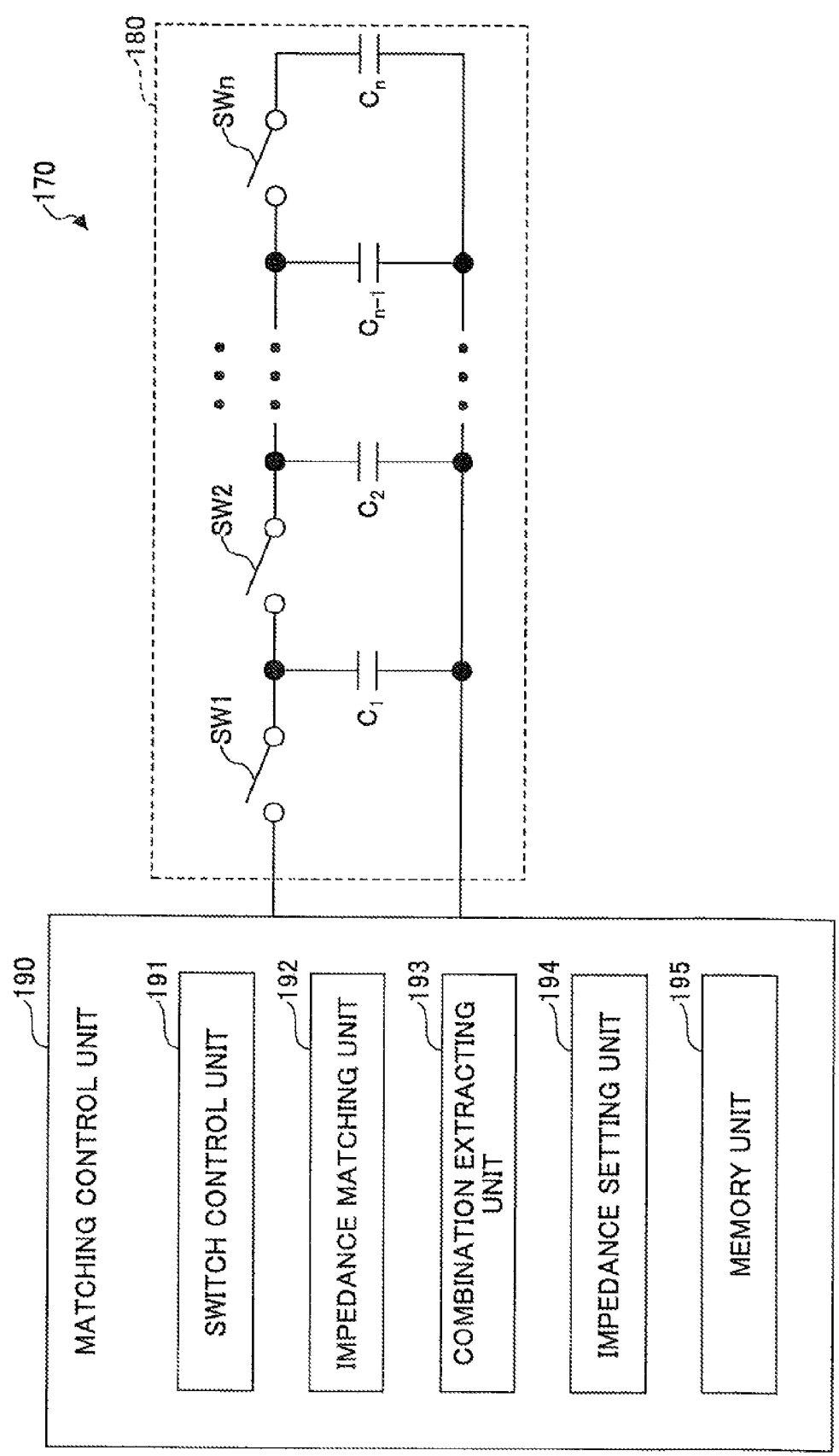
FIG. 5 is a diagram showing an impedance matching circuit in the amplifier circuit according to the embodiment.

Next, the impedance matching circuit 170 will be described with reference to FIG. 5. FIG. 5 is a diagram showing the impedance matching circuit 170 in the amplifier circuit 100 according to the embodiment.

As shown in FIG. 5, the impedance matching circuit 170 includes a switch unit 180 and a matching control unit 190. The switch unit 180 includes a plurality of capacitors $C_1$-$C_n$ connected in parallel and a plurality of switches SW1-SWn respectively provided for connecting the capacitors $C_1$-$C_n$ to the terminals T1 and T2. The switch unit 180 is connected to the matching control unit 190. The matching control unit 190 selects some of the capacitors included in the switch unit 180 so that the selected capacitors may be connected to the terminals T1 and T2.

In the switch unit 180, the switches SW1-SWn correspond to the capacitors $C_1$-$C_n$ respectively, and turning ON and OFF of the switches SW1-SWn is controlled by the matching control unit 190.

The matching control unit 190 includes a switch control unit 191, an impedance matching unit 192, a combination extracting unit 193, an impedance setting unit 194, and a memory unit 195.

The switch control unit 191 controls turning ON and OFF of the switch unit 180. The impedance matching unit 192 changes the switches SW1-SWn which are turned ON and changes the capacity of the switch unit 180 so that matching of the impedance of the antenna module 10 is performed.

The combination extracting unit 193 extracts a combination of capacitors from among all possible combinations of the capacitors $C_1$-$C_n$ included in the switch unit 180 with which the amplitude (output value) of the signal output by the attenuator 150 is at the maximum.

Next, operation of the impedance matching circuit 170 in the amplifier circuit 100 according to the embodiment will be described. The impedance matching which will be described later may be performed upon startup of the device carrying the antenna module 10.

During the impedance matching, the impedance matching circuit 170 causes the switch control unit 191 to turn ON the switch unit 180 so that the superposition wave generating unit 110 and the attenuator 150 are connected together via the switch 180. Specifically, the switch control unit 191 causes the switch unit 180 to be turned ON so that the superposition wave generating unit 110 and the attenuator 150 are connected together via the ON-state switch unit 180.

When the superposition wave generating unit 110 and the attenuator 150 are connected, a superposition signal of a frequency which is the same as the frequency of the carrier signal, generated by the superposition wave generating unit 110, is input to the attenuator 150. For example, the frequency of the signal generated at this time may be 13.56 MHz.

Subsequently, the impedance matching circuit 170 causes the impedance matching unit 192 to turn ON the switches SW1-SWn included in the switch unit 180 sequentially switch by switch.

The impedance matching unit 192 controls turning ON and OFF of the switches SW1-SWn and acquires respective output values of the attenuator 150 corresponding to all capacity values that may be taken for all possible combinations of the capacitors $C_1$-$C_n$ of the switch unit 180. Subsequently, the combination extracting unit 193 extracts a combination of capacitors from among the capacitors $C_1$-$C_n$ for which the acquired output value is at the maximum.

Subsequently, the impedance setting unit 194 sets up corresponding ones of the switches SW1-SWn in the switch unit 180 for turning ON the extracted capacitors to be in an ON state. For example, the information indicating which of the switches SW1-SWn in the switch unit 180 are set up in an ON state is stored in the memory unit 195 as setting information.

Accordingly, in this embodiment, the output value of the attenuator 150 for the combination of capacitors corresponding to the ON-state switches indicated by the setting information is at the maximum, and the frequency of the carrier signal may be changed to a resonant frequency. Therefore, the impedance of the antenna module 10 according to the embodiment may be changed to an optimal value.

In the above embodiment, the impedance when the output value of the attenuator 150 is at the maximum is used as the matched impedance. However, the present disclosure is not limited to this embodiment. For example, when there are very many combinations of capacitors that must be monitored, impedance when the output value of the attenuator 150 is greater than a predetermined threshold value may be used as the matched impedance.

In this case, the combination extracting unit 193 compares the output value of the attenuator 150 with the threshold value stored beforehand in the memory unit 195. When the output value of the attenuator 150 is less than the threshold value, the impedance matching unit 192 changes the ON-state switches of the switches SW1-SWn.

For example, the impedance matching unit 192 turns ON the switch SW1 and connects the capacitor $C_1$ to the terminals T1 and T2. At this time, the combination extracting unit 193 detects whether the output value of the attenuator 150 is greater than the threshold value. When it is detected that the output value of the attenuator 150 is less than the threshold value, the impedance matching unit 192 turns ON the switches SW1 and SW2, and the same detecting process is repeated.

When it is detected that the output value of the attenuator 150 is greater than the threshold value, the impedance setting unit 194 sets up the switches SW1 and SW2 for that combination of capacitors as being the ON state switches.

In this embodiment, the threshold value is predetermined as being a value adequate for performing radio communication. Hence, in this embodiment, the impedance matching may be performed so that the output value of the attenuator 150 is greater than the threshold value, and the communication performance may be maintained.

In this embodiment, the impedance matching circuit 170 included in the amplifier circuit 100 performs the impedance matching, and it is unnecessary to perform matching of the impedance for each of individual devices on which the antenna module 10 is carried.

In the above embodiment, the impedance matching circuit 170 performs the impedance matching by using the plural capacitors in the switch unit 180 which are connected in parallel. However, the present disclosure is not limited to this embodiment. For example, a plurality of resistors connected in series may be used for performing the impedance matching.

In this embodiment, the impedance matching for every device may be automatically performed by matching the impedance of the antenna module 10, and the communication performance may be maintained.

Figure 6:
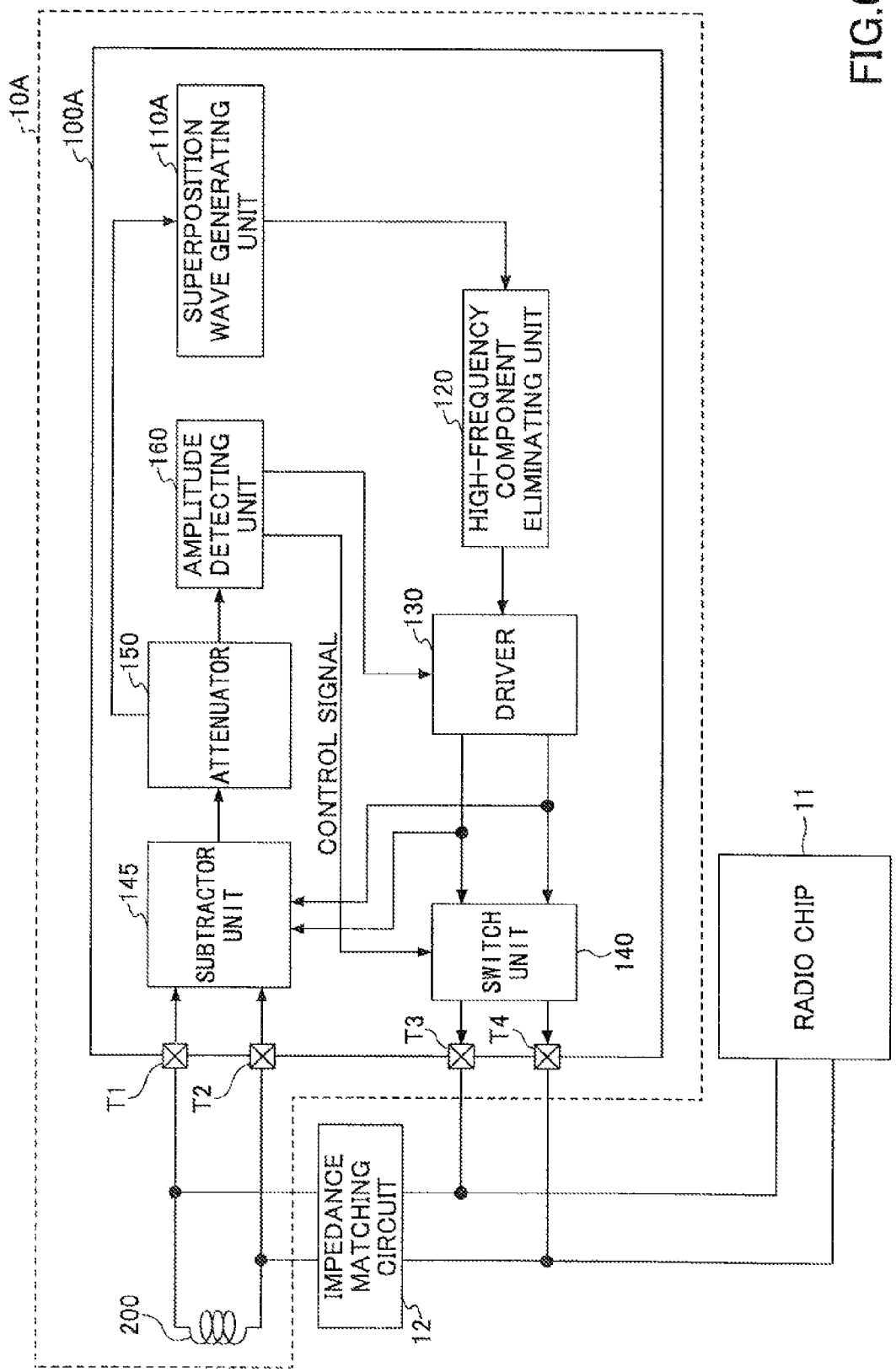
FIG. 6 is a diagram showing an amplifier circuit according to another embodiment.

Next, FIG. 6 is a diagram showing an amplifier circuit 100A according to another embodiment.

In this embodiment, a superposition signal of a predetermined frequency is superimposed on a carrier signal received from an antenna, the superposition signal is synchronized in phase with the carrier signal, and the carrier signal superimposed with the superposition signal is output to a radio communication device. Hence, a small-sized antenna may be provided and the communication performance may be maintained.

As shown in FIG. 6, the amplifier circuit 100A includes a superposition wave generating unit 110A, a high-frequency component eliminating unit 120, a driver 130, a switch unit 140, a subtractor unit 145, an attenuator 150, and an amplitude detecting unit 160. The amplifier circuit 100A further includes a plurality of terminals T1-T4. In the amplifier circuit 100A, the terminals T1 and T2 serve as input terminals, and the terminals T3 and T4 serve as output terminals.

In the amplifier circuit 100A, the input terminals T1 and T2 are connected to the antenna 200, and the output terminals T3 and T4 are connected to the radio chip 11. The antenna 200 is connected to the radio chip 11 via an impedance matching circuit 12. The impedance matching circuit 12 is a circuit which performs matching of the impedance between the antenna 200 and the radio chip 11.

The amplifier circuit 100A detects whether a carrier signal received from the terminals T1 and T2 is a predetermined carrier signal on which a predetermined communication signal is carried, based on changes of the amplitude value of the received carrier signal. When the predetermined carrier signal is detected, the amplifier circuit 100A superimposes the received carrier signal with a superposition signal (superposition wave) of a predetermined frequency synchronized in phase with the received carrier signal, amplifies such carrier signal and outputs the amplified carrier signal to the impedance matching circuit 12 and the radio chip 11.

The radio chip 11 used for the amplifier circuit 100A according to this embodiment is essentially the same as the radio chip 11 used for the amplifier circuit 100 according to the previously described embodiment, and a description thereof will be omitted.

In the amplifier circuit 100A shown in FIG. 6, the superposition wave generating unit 110A generates a superposition wave of a predetermined frequency so that the superposition wave is superimposed on the modulation carrier signal received from the antenna 200. In this embodiment, the generated superposition wave is synchronized in phase with the modulation carrier signal which is received from, for example, an RFID reader, and the frequency of the superposition wave is equal to the frequency of the modulation carrier signal. For example, the superposition wave generating unit 110A may be implemented by a PLL (phase locked loop) circuit.

The high-frequency component eliminating unit 120 eliminates a high-frequency component from the superposition wave generated by the superposition wave generating unit 110A. The driver 130 outputs an amplified modulation carrier signal that is obtained by adding the superposition wave to the modulation carrier signal and amplifying the modulation carrier signal.

The switch unit 140 is provided to control connection between the output of the driver 130 and the output terminals T3 and T4. Turning ON and OFF of the switch unit 140 is controlled in response to a control signal output from the amplitude detecting unit 160.

The subtractor unit 145 is connected between the input terminals T1 and T2 and the input of the attenuator 150 and subtracts the signal from the output of the driver 130 from the carrier signal from the input terminals T1 and T2.

The attenuator 150 attenuates the amplitude of the carrier signal from the output of the subtractor unit 145. The amplitude detecting unit 160 detects a modulation carrier signal from the carrier signal received from the terminals T1 and T2 via the attenuator 150, and supplies the detected modulation carrier signal to the driver 130. When the modulation carrier signal is detected, the amplitude detecting unit 160 outputs a control signal to the switch unit 140 so that the switch unit 140 is turned ON by the control signal.

Next, operation of the antenna module 10A according to the embodiment will be described. First, operation of the antenna module 10A to receive a modulation carrier signal will be described. In the antenna module 10A, when a signal is received from the input terminals T1 and T2 via the antenna 200, the received signal is supplied to the subtractor unit 145. The subtractor unit 145 subtracts the signal from the output of the driver 130 from the received signal and outputs the resulting signal to the attenuator 150 as a carrier signal. This carrier signal is supplied to the amplitude detecting unit 160 via the attenuator 150.

The amplitude detecting unit 160 detects whether the received signal is a modulation carrier signal based on the amplitude of the carrier signal received via the attenuator 150. For example, the amplitude detecting unit 160 may be implemented by a binarization circuit, such as a comparator including a carrier eliminating filter. When the amplitude value of the carrier signal received from the attenuator 150 indicates the amplitude H1 (FIG. 4), the amplitude detecting unit 160 may output a high-level (H level) binary signal. When the amplitude value of the carrier signal indicates the amplitude H2 (FIG. 4), the amplitude detecting unit 160 may output a low-level (L level) binary signal. In the following, the binary signal output by the amplitude detecting unit 160 based on the amplitude detected by the amplitude detecting unit 160 will be called a modulation binary signal.

For example, when the binary value of the modulation binary signal output by the amplitude detecting circuit 160 changes in a sequential pattern of 1 (the H level at a first period T1), 0 (the L level at a second period T2), 1 (the H level at a third period T3), . . . as shown in FIG. 4, the amplitude detecting circuit 160 detects the carrier signal input to the terminals T1 and T2 as being the modulation carrier signal. However, the method of detecting the modulation carrier signal by the amplitude detecting unit 160 is not limited to the above-described pattern method. Alternatively, the amplitude detecting unit 160 may be configured to detect the input carrier signal as being the modulation carrier signal when the binary value of the modulation binary signal changes in a predetermined sequential pattern, for example.

When the modulation binary signal is detected, the amplitude detecting unit 160 outputs a control signal to the switch unit 140 so that the switch unit 140 is turned ON or OFF. Specifically, the amplitude detecting unit 160 outputs the control signal causing the switch unit 140 to be turned ON, when the modulation carrier signal is detected. Further, the amplitude detecting unit 160 outputs the detected modulation carrier signal to the driver 130 at the same time.

In this embodiment, the input carrier signal is supplied to the superposition wave generating unit 110A via the attenuator 150. It is preferred that the superposition wave generating unit 110A is able to perform phase correction to match the phase of the carrier signal and the phase of the superposition wave.

When the switch unit 140 is turned ON by the control signal, the driver 130 is connected to the terminals T3 and T4 by the ON-state switch unit 140.

In this embodiment, the superposition wave generated by the superposition wave generating unit 110A and the modulation carrier signal supplied through the amplitude detecting unit 160 are input to the driver 130. In the driver 130, the modulation carrier signal is converted into an amplified modulation carrier signal which is obtained by adding the superposition wave to the modulation carrier signal and amplifying the modulation carrier signal. This amplified modulation carrier signal is supplied to the radio chip 11 via the terminals T3 and T4.

Next, a function of the subtractor unit 145 in the amplifier circuit 100A according to the embodiment will be described. The subtractor unit 145 is a carrier detecting unit adapted to detect a carrier signal from the signal received from the terminals T1 and T2 with good precision.

The terminals T1 and T2 of the amplifier circuit 100A according to the embodiment are connected to the terminals T3 and T4 via the impedance matching circuit 12. In the amplifier circuit 100A, there may be a case in which the signal output from the terminals T3 and T4 of the amplifier circuit 100A is added to the carrier signal input from the terminals T1 and T2. In such a case, the amplitude value of the carrier signal may be altered due to the output signal of the amplifier circuit 100A itself, and it may be difficult to correctly detect the carrier signal as being a modulation carrier signal.

To eliminate the problem, the subtractor unit 145 subtracts the signal from the output of the driver 130 from the signal received from the terminals T1 and T2. Hence, as a result of the subtraction, the output of the subtractor unit 145 provides only the carrier signal received from the antenna 200.

Accordingly, in this embodiment, the carrier signal received from the antenna 200 may be detected with good precision. Hence, the amplitude detecting unit 160 may detect changes of the amplitude value of the carrier signal correctly. Further, the superposition wave generating unit 110A may generate the superposition wave of the frequency which is equal to the frequency of the carrier signal, the superposition wave being synchronized in phase with the carrier signal.

Next, operation of the antenna module 10A according to the embodiment to transmit a response signal output from the radio chip 11 will be described.

In the antenna module 10A, the terminals T1 and T2 of the amplifier circuit 100A are connected to the radio chip 11. Hence, there may be a case in which the response signal output from the radio chip 11 is input to the antenna module 10A. In such a case, the amplitude value of the carrier signal received from the terminals T1 and T2 may be altered due to the input signal to the amplifier circuit 100A. Hence, the switch unit 140 remains in an OFF state, the driver 130 is not connected to the terminals T3 and T4, and the antenna module 10A does not output any signal.

Accordingly, only the signal output from the radio chip 11 is supplied to the antenna 200 and transmitted from the antenna 200.

As described above, in this embodiment, only when the carrier signal received from the antenna 200 is detected as being the modulation carrier signal on which the communication signal is carried, the amplified modulation carrier signal which is obtained by adding the superposition wave to the modulation carrier signal and amplifying the modulation carrier signal may be supplied to the radio chip 11. Therefore, in the amplifier circuit 100A according to the embodiment, a small-sized antenna may be provided and the communication performance may be maintained.

In the above embodiment, when the modulation carrier signal is detected, the amplitude detecting unit 160 outputs the control signal to the switch unit 140 so that the switch unit 140 is turned ON, and the driver 130 is connected to the terminals T3 and T4. However, the present disclosure is not limited to this embodiment.

For example, the above embodiment may be modified so that only when the amplitude value of the carrier signal indicates the amplitude H1, the amplitude detecting unit 160 outputs the control signal to the switch unit 140 so that the switch unit 140 is turned ON to connect the driver 130 to the terminals T3 and T4. In this case, the switch unit 140 is turned ON at the first period T1 and at the third period T3 respectively as shown in FIG. 4 and the superposition wave is added to the carrier signal. Hence, the amplitude value of the amplified modulation carrier signal output from the driver 130 is increased only at the periods T1 and T3 respectively, and the amount of the amplitude change may be increased.

Furthermore, the above embodiment may be modified so that a superposition wave having a phase opposite to the phase of the carrier signal is generated and the superposition wave having the opposite phase is added to the carrier signal only when the amplitude value of the carrier signal indicates the amplitude H2. In this case, the amplitude value H2 of the carrier signal is canceled by the superposition wave added thereto, and the amplitude change of the modulation carrier signal may be increased.

In the above embodiment, the antenna module 10A has the composition including the amplifier circuit 100A and the antenna 200. Alternatively, the antenna module 10A may further include the radio chip 11 in addition to the amplifier circuit 100A and the antenna 200. Further, in the above embodiment, the radio chip 11 and the amplifier circuit 100A are connected in parallel with the antenna 200. The present disclosure is not limited to this embodiment. For example, the radio chip 11 may be connected to the latter-stage part of the amplifier circuit 100A.

Next, an amplifier circuit 100B according to another embodiment will be described. The amplifier circuit 100B according to this embodiment differs from the amplifier circuit 100A according to the previously described embodiment in that an additional antenna which functions as a carrier detecting unit is provided. Other elements of the amplifier circuit 100B which are essentially the same as corresponding elements of the amplifier circuit 100A are designated by the same reference numerals, and a description thereof will be omitted.

Figure 7:
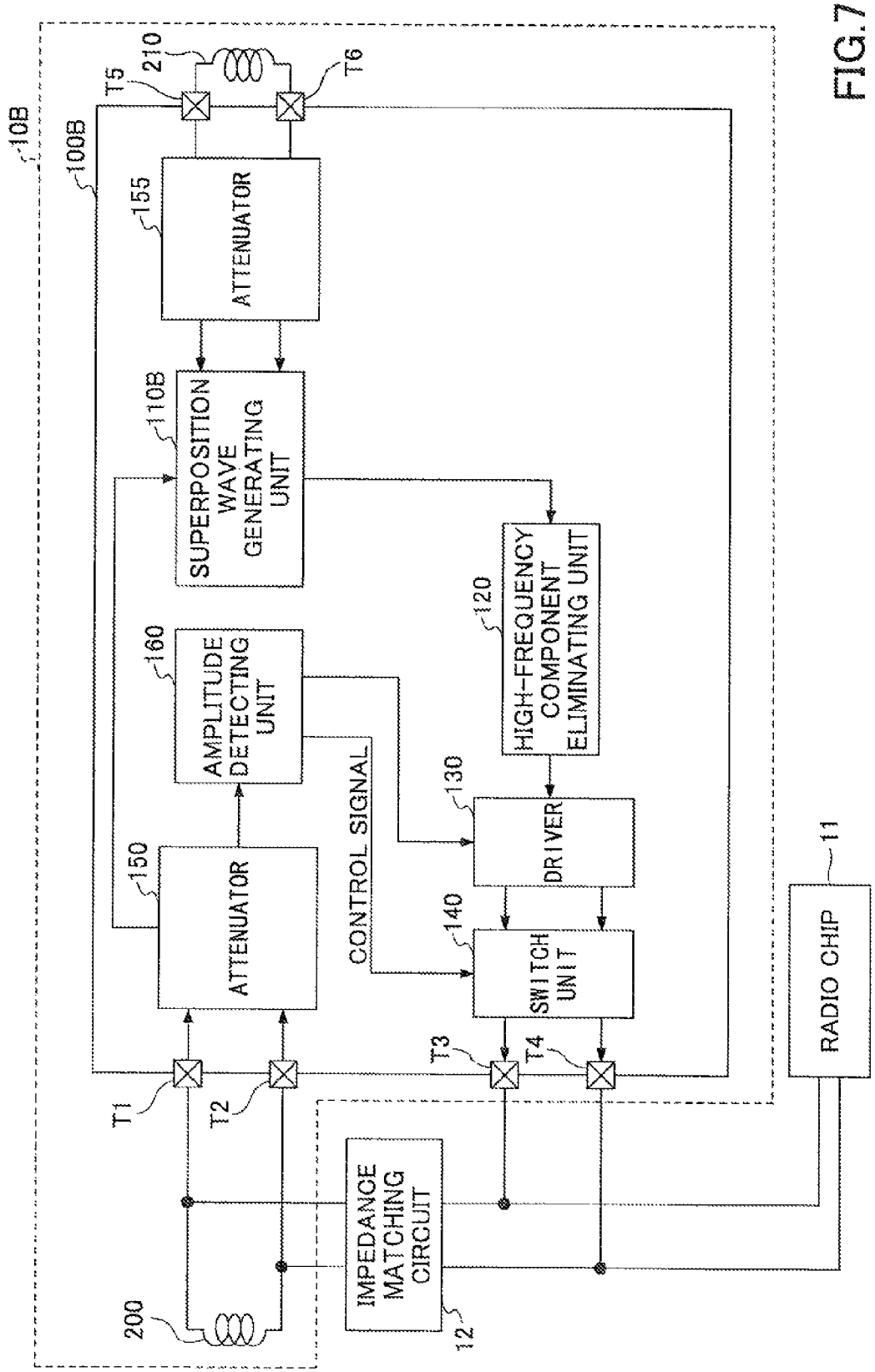
FIG. 7 is a diagram showing an amplifier circuit according to another embodiment.

FIG. 7 is a diagram showing the amplifier circuit 100B according to this embodiment.

As shown in FIG. 7, an antenna module 10B includes the amplifier circuit 100B according to the embodiment, an antenna 200, and an antenna 210. The amplifier circuit 100B includes a superposition wave generating unit 110B, a high-frequency component eliminating unit 120, a driver 130, a switch unit 140, attenuators 150 and 155, and an amplitude detecting unit 160. The amplifier circuit 100B further includes a plurality of terminals T1-T6. In the amplifier circuit 100B, each of the antennas 200 and 210 is implemented by an antenna with equivalent characteristics. Hence, each of the antennas 200 and 210 receives a carrier signal in the same manner.

In the amplifier circuit 100B, the antenna 210 is connected to the attenuator 155 via the terminals T5 and T6. An output signal from the output of the attenuator 155 is supplied to the superposition wave generating unit 110B.

When the amplitude detecting unit 160 detects the carrier signal received from the antenna 200 as being a modulation carrier signal, the superposition wave generating unit 110B generates a superposition wave of a predetermined frequency based on the carrier signal received from the antenna 210. For example, the superposition wave generating unit 110B is implemented by a PLL circuit. Specifically, the superposition wave generating unit 110B generates a superposition wave whose frequency is equal to the frequency of the carrier signal received from the antenna 210, and the generated superposition wave is synchronized in phase with the carrier signal received from the antenna 210.

In this embodiment, the antenna 210 which receives the carrier signal that is the same as that received by the antenna 200 is connected to the superposition wave generating unit 110B via the attenuator 155, and the superposition wave generating unit 110B generates the superposition wave based on the carrier signal from the antenna 210. Hence, even when the output signal of the amplifier circuit 100B output from the terminals T3 and T4 is added to the carrier signal received from the terminals T1 and T2, the superposition wave generating unit 110B may detect the carrier signal received from the antenna 210 with good precision and generate the superposition wave whose phase is synchronized with the phase of the received carrier signal.

In the above embodiment, the superposition wave generating unit 110B generates the superposition wave when the modulation carrier signal is detected by the amplitude detecting unit 160. However, the present disclosure is not limited to this embodiment. For example, the above embodiment may be modified so that the superposition wave generating unit 110B always generates a superposition wave and supplies the superposition wave to the high-frequency component eliminating unit 120, because the amplitude detecting unit 160 is not connected to the superposition wave generating unit 110B in the amplifier circuit 100B.

In this case, it is necessary that the amplitude detecting unit 160 outputs a modulation carrier signal to the driver 130 when the modulation carrier signal is detected, and outputs the control signal to the switch unit 140 so that the switch unit 140 is turned ON. In this way, only when the modulation carrier signal is detected, the superposition wave generated by the superposition wave generating unit 110B based on the carrier signal received from the antenna 210 is superimposed on the modulation carrier signal output from the amplitude detecting unit 160, and the modulation carrier signal superimposed with the superposition wave is supplied to the radio chip 11.

In the above embodiment, the attenuator 155 is connected between the antenna 210 and the superposition wave generating unit 110B. However, the present disclosure is not limited to this embodiment. For example, the antenna 210 may be directly connected to the superposition wave generating unit 110B without utilizing the attenuator 155.

In the amplifier circuit according to the embodiment, a small-sized antenna may be provided and the communication performance may be maintained.

The amplifier circuit according to the present disclosure is not limited to the above-described embodiments, and variations and modifications may be made without departing from the scope of the present disclosure.

The present application is based on and claims the benefit of the priority of Japanese Patent Application No. 2013-027730, filed on Feb. 15, 2013, and Japanese Patent Application No. 2013-050874, filed on Mar. 13, 2013, the entire contents of which are hereby incorporated by reference.

The invention claimed is:

1. An amplifier circuit that performs an amplification of a carrier signal received by a transmitting and receiving unit, comprising:
   an impedance matching circuit that performs matching of an impedance of the amplifier circuit when the transmitting and receiving unit and the amplifier circuit are connected;
   a superposition wave generating unit that generates a superposition wave which is superimposed on the received carrier signal;
   a driver that outputs an amplified carrier signal which is obtained by adding the superposition wave to the received carrier signal; and
   an amplitude detecting unit that detects whether the received carrier signal is a predetermined carrier signal superimposed with a predetermined communication signal, based on changes of an amplitude value of the received carrier signal,
   wherein, when the predetermined carrier signal is detected, the amplifier circuit outputs the amplified carrier signal, and
   wherein a frequency of the superposition wave is equal to a frequency of the received carrier signal,
   the amplifier circuit further comprises an attenuator that receives the superposition wave from the superposition wave generating unit, and
   the impedance matching impedance of the amplifier circuit when an output value of the attenuator is at its maximum to be a matched impedance of the amplifier circuit.

2. The amplifier circuit according to claim 1, further comprising a switch unit that controls connection between an output of the driver and an output terminal of the amplifier circuit,
   wherein, when the predetermined carrier signal is detected, the amplitude detecting unit outputs a control signal to the switch unit, so that the output of the driver is connected to the output terminal by the switch unit.

3. An antenna module comprising:
   a transmitting and receiving unit that transmits and receives a signal by radio; and
   the amplifier circuit according to claim 1,
   wherein, when the predetermined carrier signal is detected based on the signal received by the transmitting and receiving unit, the amplifier circuit outputs the amplified carrier signal.

4. A radio communication device comprising:
a transmitting and receiving unit that transmits and receives a signal by radio;
the amplifier circuit according to claim 1; and
a radio communication unit that performs radio communication using the amplified carrier signal received from the amplifier circuit,
wherein, when the predetermined carrier signal is detected based on the signal received by the transmitting and receiving unit, the amplifier circuit outputs the amplified carrier signal to the radio communication unit.

5. An amplifier circuit comprising:
a carrier detecting unit that detects a carrier signal from an input signal;
an amplitude detecting unit that detects whether the detected carrier signal is a predetermined carrier signal on which a predetermined communication signal is carried based on changes of an amplitude value of the detected carrier signal;
a superposition wave generating unit that generates a superposition wave which is superimposed on and synchronized in phase with the detected carrier signal; and
a driver that outputs an amplified carrier signal which is obtained by adding the superposition wave to the detected carrier signal and amplifying the detected carrier signal,
wherein, when the predetermined carrier signal is detected, the amplifier circuit outputs the amplified carrier signal;
an input terminal connected to a transmitting and receiving unit that receives the carrier signal; and
an output terminal connected to the input terminal via an external circuit, the amplified carrier signal being output via the output terminal,
wherein the carrier detecting unit is a subtractor unit that subtracts the amplified carrier signal received from the driver from the input signal received from the input terminal.

6. The amplifier circuit according to claim 5, further comprising a switch unit that controls connection between an output of the driver and an output terminal of the amplifier circuit,
wherein, when the predetermined carrier signal is detected, the amplitude detecting unit outputs a control signal to the switch unit so that the output of the driver is connected to the output terminal by the switch unit.

7. The amplifier circuit according to claim 6, further comprising a switch control unit which controls the switch unit to provide an OFF period for which the output of the driver is disconnected from the output terminal,
wherein the superposition wave generating unit generates a superposition wave whose phase is synchronized with a phase of the carrier signal received during the OFF period of the switch unit.

8. An antenna module comprising:
a transmitting and receiving unit that transmits and receives a signal by radio; and
the amplifier circuit according to claim 5,
wherein, when the predetermined carrier signal is detected based on the signal received by the transmitting and receiving unit, the amplifier circuit outputs the amplified carrier signal.

9. A radio communication device comprising:
a transmitting and receiving unit that transmits and receives a signal by radio;
the amplifier circuit according to claim 5; and
a radio communication unit that performs radio communication using the amplified carrier signal received from the amplifier circuit,
wherein, when the predetermined carrier signal is detected based on the signal received by the transmitting and receiving unit, the amplifier circuit outputs the amplified carrier signal to the radio communication unit.

10. An amplifier circuit that performs an amplification of a carrier signal received by a transmitting and receiving unit, comprising:
an impedance matching circuit that performs matching of an impedance of the amplifier circuit when the transmitting and receiving unit and the amplifier circuit are connected;
a superposition wave generating unit that generates a superposition wave which is superimposed on the received carrier signal;
a driver that outputs an amplified carrier signal which is obtained by adding the superposition wave to the received carrier signal; and
an amplitude detecting unit that detects whether the received carrier signal is a predetermined carrier signal superimposed with a predetermined communication signal, based on changes of an amplitude value of the received carrier signal,
wherein, when the predetermined carrier signal is detected, the amplifier circuit outputs the amplified carrier signal, and
wherein a frequency of the superposition wave is equal to a frequency of the received carrier signal;
the amplifier circuit further comprises an attenuator that receives the superposition wave from the superposition wave generating unit; and
the impedance matching circuit sets up an impedance of the amplifier circuit when an output value of the attenuator is greater than a predetermined threshold value to be a matched impedance of the amplifier circuit.

11. The amplifier circuit according to claim 10, further comprising
a switch unit that controls connection between an output of the driver and an output terminal of the amplifier circuit,
wherein, when the predetermined carrier signal is detected, the amplitude detecting unit outputs a control signal to the switch unit, so that the output of the driver is connected to the output terminal by the switch unit.

12. An antenna module comprising:
a transmitting and receiving unit that transmits and receives a signal by radio; and
the amplifier circuit according to claim 10,
wherein, when the predetermined carrier signal is detected based on the signal received by the transmitting and receiving unit, the amplifier circuit outputs the amplified carrier signal.

13. A radio communication device comprising:
a transmitting and receiving unit that transmits and receives a signal by radio;
the amplifier circuit according to claim 10; and
a radio communication unit that performs radio communication using the amplified carrier signal received from the amplifier circuit,
wherein, when the predetermined carrier signal is detected based on the signal received by the transmitting and receiving unit, the amplifier circuit outputs the amplified carrier signal to the radio communication unit.

14. An amplifier circuit comprising:
a carrier detecting unit that detects a carrier signal from an input signal;
an amplitude detecting unit that detects whether the detected carrier signal is a predetermined carrier signal on which a predetermined communication signal is carried based on changes of an amplitude value of the detected carrier signal;
a superposition wave generating unit that generates a superposition wave which is superimposed on and synchronized in phase with the detected carrier signal; and
a driver that outputs an amplified carrier signal which is obtained by adding the superposition wave to the detected carrier signal and amplifying the detected carrier signal,
wherein, when the predetermined carrier signal is detected, the amplifier circuit outputs the amplified carrier signal;
an input ten final connected to a transmitting and receiving unit that receives the carrier signal; and
an output terminal connected to the input terminal via an external circuit, the amplified carrier signal being output via the output terminal,
wherein the carrier detecting unit is a second transmitting and receiving unit that receives the carrier signal which is identical to the carrier signal received by the transmitting and receiving unit, and
the superposition wave generating unit generates a superposition wave whose phase is synchronized with a phase of the carrier signal received by the second transmitting and receiving unit.

15. The amplifier circuit according to claim 14, further comprising
a switch unit that controls connection between an output of the driver and an output terminal of the amplifier circuit,
wherein, when the predetermined carrier signal is detected, the amplitude detecting unit outputs a control signal to the switch unit so that the output of the driver is connected to the output terminal by the switch unit.

16. An antenna module comprising:
a transmitting and receiving unit that transmits and receives a signal by radio; and
the amplifier circuit according to claim 14,
wherein, when the predetermined carrier signal is detected based on the signal received by the transmitting and receiving unit, the amplifier circuit outputs the amplified carrier signal.

17. A radio communication device comprising:
a transmitting and receiving unit that transmits and receives a signal by radio;
the amplifier circuit according to claim 14; and
a radio communication unit that performs radio communication using the amplified carrier signal received from the amplifier circuit,
wherein, when the predetermined carrier signal is detected based on the signal received by the transmitting and receiving unit, the amplifier circuit outputs the amplified carrier signal to the radio communication unit.

* * * * *